(12) United States Patent
Chen

(10) Patent No.: US 10,424,718 B2
(45) Date of Patent: Sep. 24, 2019

(54) PIEZOELECTRIC FILM, PIEZOELECTRIC DEVICE, AND METHOD FOR MAKING PIEZOELECTRIC FILM

(71) Applicant: Xianfeng Chen, Kanagawa (JP)

(72) Inventor: Xianfeng Chen, Kanagawa (JP)

(73) Assignee: Ricoh Company, Ltd., Tokyo (JP)

(*) Notice: Subject to any disclaimer, the term of this patent is extended or adjusted under 35 U.S.C. 154(b) by 372 days.

(21) Appl. No.: 15/267,241

(22) Filed: Sep. 16, 2016

(65) Prior Publication Data

US 2017/0092836 A1    Mar. 30, 2017

(30) Foreign Application Priority Data

Sep. 25, 2015 (JP) .................... 2015-188292

(51) Int. Cl.
*H01L 41/08* (2006.01)
*H01L 41/41* (2013.01)

(52) U.S. Cl.
CPC ............ *H01L 41/081* (2013.01); *H01L 41/41* (2013.01)

(58) Field of Classification Search
CPC .................... H01L 41/18; H01L 41/187

USPC ....................................................... 310/358
See application file for complete search history.

(56) References Cited

U.S. PATENT DOCUMENTS

| 6,927,084 B2 | 8/2005 | Fukui et al. |
| 2005/0168112 A1* | 8/2005 | Aoki ............ B41J 2/14233 310/358 |
| 2014/0042574 A1* | 2/2014 | Carman ............ H01L 41/1875 257/421 |
| 2014/0216643 A1 | 8/2014 | Chen |
| 2015/0068673 A1 | 3/2015 | Chen |
| 2016/0023466 A1 | 1/2016 | Chen |

FOREIGN PATENT DOCUMENTS

| JP | 2003-309304 | 10/2003 |
| JP | 2014-154581 | 8/2014 |

* cited by examiner

*Primary Examiner* — Derek J Rosenau
(74) *Attorney, Agent, or Firm* — IPUSA, PLLC

(57) ABSTRACT

A method for producing a piezoelectric film includes forming a metal film, recrystallizing a portion of the metal film by heating, forming an amorphous film of piezoelectric material on the metal film; and heating the amorphous film at a position of the recrystallized portion of the metal film.

7 Claims, 9 Drawing Sheets

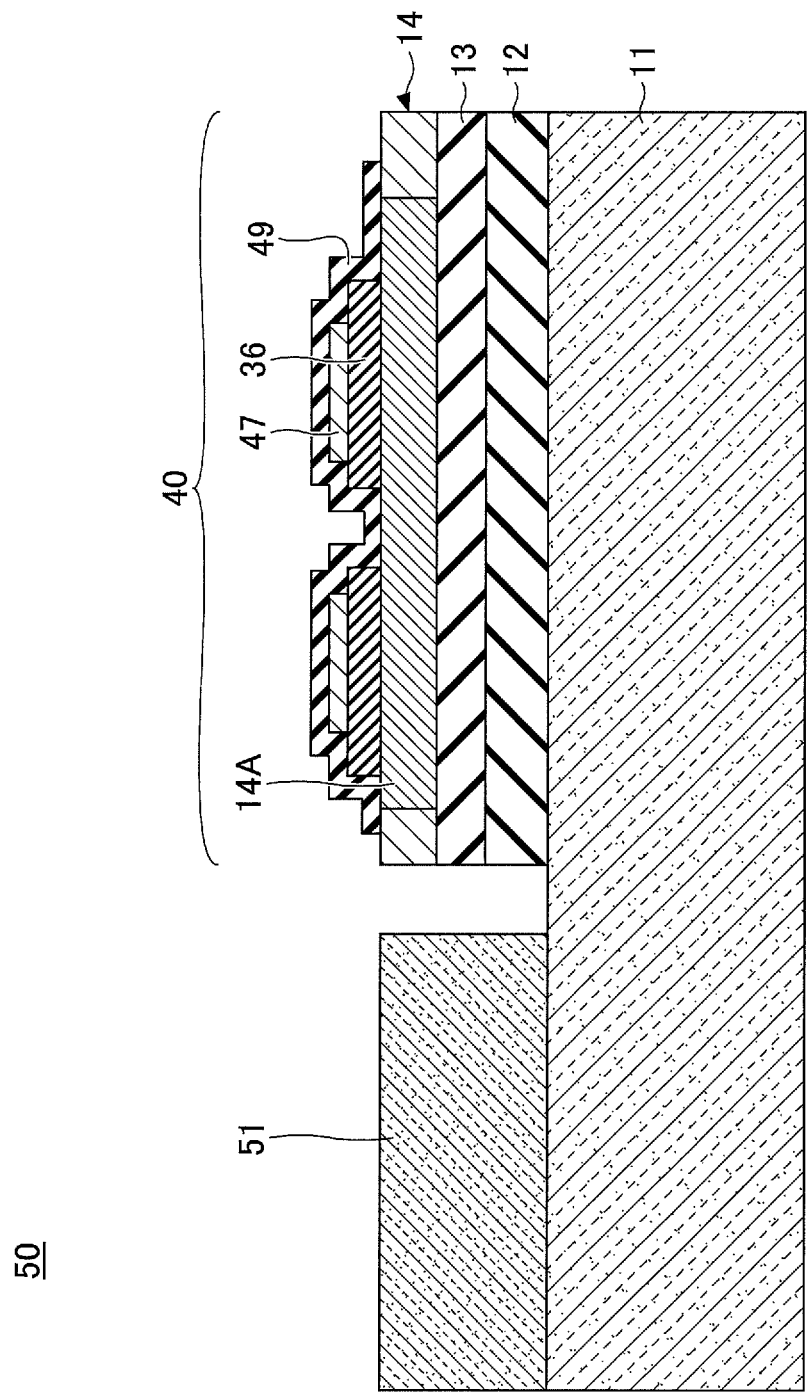

PIEZOELECTRIC FILM, PIEZOELECTRIC DEVICE, AND METHOD FOR MAKING PIEZOELECTRIC FILM

CROSS-REFERENCE TO RELATED APPLICATIONS

The present application claims priority under 35 U.S.C. § 119 to Japanese Patent Application No. 2015-188292, filed on Sep. 25, 2015, the contents of which are incorporated herein by reference in their entirety.

BACKGROUND OF THE INVENTION

1. Field of the Invention

The disclosures herein relate to a piezoelectric film, a piezoelectric device, and a method of making a piezoelectric film.

2. Description of the Related Art

Piezoelectric material has functions to perform conversion between an electric signal and a mechanical displacement or pressure, and is thus used in various devices such as sensors and actuators. PZT, for example, may be used as a piezoelectric material. A method of making a PZT crystal film may include a sol-gel process, a sputtering process, etc. In comparison to other methods, a sol-gel process has an advantage that multicomponent oxide having the composition exactly as designed can be evenly formed over a wide area at low cost, and is thus widely used as an effective film forming process.

SUMMARY OF THE INVENTION

In one embodiment, a method for producing a piezoelectric film includes forming a metal film, recrystallizing a portion of the metal film by heating, forming an amorphous film of piezoelectric material on the metal film; and heating the amorphous film at a position of the recrystallized portion of the metal film.

BRIEF DESCRIPTION OF THE DRAWINGS

Other objects and further features of embodiments will be apparent from the following detailed description when read in conjunction with the accompanying drawings, in which:

FIG. 9 is a cross-sectional view illustrating an example of a piezoelectric device according to a fifth embodiment.

DESCRIPTION OF THE PREFERRED EMBODIMENTS

In order to form a PZT crystal film on a Pt film (platinum film) disposed on a silicon substrate, for example, a PZT amorphous film formed on the Pt film is subjected to heating over 600 degrees Celsius for more than a required time length by use of an electric furnace, an RTA (rapid thermal annealing) apparatus, or the like.

Making a PZT crystal film having good crystalline quality requires the use of a Pt film having good crystalline quality as an under layer for the PZT crystal film. In order to provide a Pt film having good crystalline quality, the temperature of the silicon substrate is preferably set to higher than 500 degrees Celsius when forming the Pt film on the silicon substrate by sputtering. Because of this, a sputter apparatus is required to have high heating performance. During such a heating process, not only the film but also the entire substrate is subjected to heating.

For the purpose of miniaturization and cost reduction of apparatuses, practice in recent years has been such that as many devices as possible are integrated on one substrate. Where the entire substrate is subjected to heating as described above, restrictions are imposed such as the need for the use of a heat-resistant substrate.

In general, the upper limit temperature of electrical circuit wires is generally around 400 degrees Celsius. When various devices and structures are disposed on a substrate, a heating process that heats the substrate over 500 degrees Celsius ends up heating all the components (all the devices and structures). The components may suffer heat-induced damage or a misalignment due to thermal stress, which may result in significant performance degradation.

Technologies to obviate these problems include using irradiation by laser light to crystalize an amorphous film selectively through local heating (see Patent Document 1, for example).

The above-noted technology locally heats an amorphous film to form a crystal film. However, eliminating the process of forming a Pt film by sputtering that heats the substrate over 500 degrees Celsius ends up failing to form a Pt film having good crystalline quality. Consequently, the piezoelectric-material crystal film formed on the Pt film ends up having insufficient crystalline quality.

Accordingly, there may be a need for at least one embodiment to provide a method of making a piezoelectric film, the method being capable of improving the crystalline quality of a piezoelectric-material crystal film without affecting other components or the like formed on the same substrate.

In the following, embodiments will be described by referring to the accompanying drawings. In these drawings, the same elements are referred to by the same references, and a description thereof may be omitted.

First Embodiment

[Structure of Piezoelectric Film]

Figure 1:
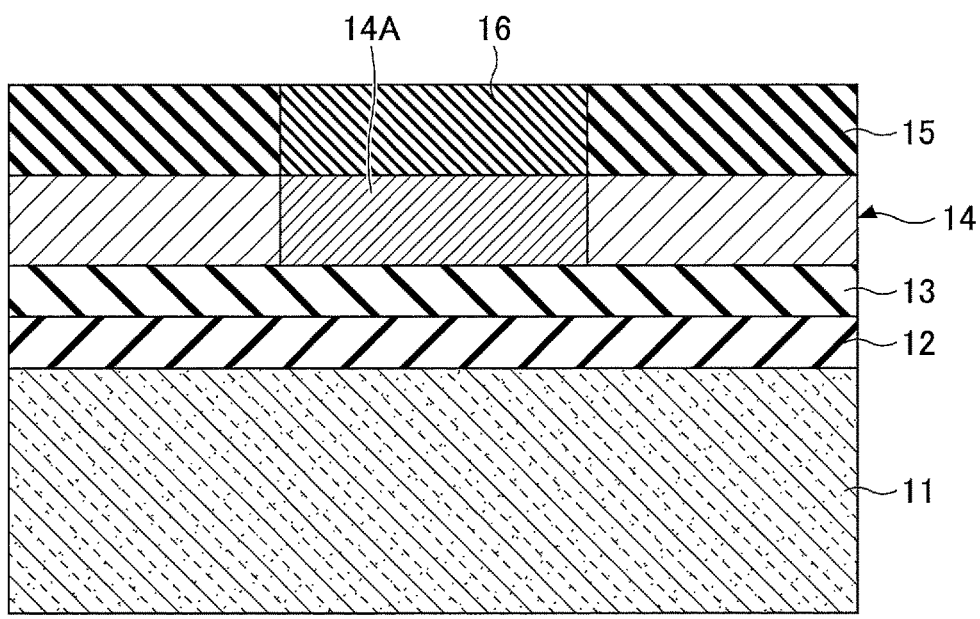
FIG. 1 is a cross-sectional view illustrating an example of a piezoelectric film according to a first embodiment.

FIG. 1 is a cross-sectional view illustrating an example of a piezoelectric film according to a first embodiment. In FIG. 1, a piezoelectric film 10 of the first embodiment includes a silicon substrate 11, a silicon oxide film ($SiO_2$ film) 12, a titanium oxide film ($TiO_x$ film) 13, a platinum film (Pt film) 14, a PZT amorphous film 15, and a PZT crystal film 16. The platinum film 14 is a representative example of a metal film used in the present invention.

It may be noted that PZT, which is a solid solution made of lead zirconate ($PbZrO_3$) and lead titanate ($PbTiO_3$), is a piezoelectric material that has characteristics varying depending on the ratio between $PbZrO_3$ and $PbTiO_3$. For example, PZT in which the ratio between $PbZrO_3$ and $PbTiO_3$ is 53:47 that is generally expressed as PZT(53/47) or expressed by use of a chemical formula as $Pb(Zr_{0.53}, Ti_{0.47})O_3$ may be used.

In the piezoelectric film 10, the silicon oxide film 12, the titanium oxide film 13, and the platinum film 14 are laminated one over another on the surface of the silicon substrate 11. The platinum film 14 has a portion thereof formed as a specific portion 14A. The specific portion 14A, which is a portion of the platinum film 14 having film characteristics thereof improved by local heating, has better crystalline quality than the other portions of the platinum film 14.

The 2θ position of an X-ray diffraction peak of the specific portion 14A is different from the 2θ position of an X-ray diffraction peak of the portions of the platinum film 14 other than the specific portion 14A. Further, the 2θ position of an X-ray diffraction peak of the specific portion 14A is higher than the 2θ position of an X-ray diffraction peak of the portions of the platinum film 14 other than the specific portion 14A.

The PZT crystal film 16 is formed on the specific portion 14A of the platinum film 14. The PZT amorphous film 15 is formed on the portions of the platinum film 14 other than the specific portion 14A. The platinum film of the specific portion 14A has better crystalline quality than the platinum of the other portions of the platinum film 14, so that the PZT crystal film 16 formed on the specific portion 14A has an improved crystalline quality.

As described above, the piezoelectric film 10 of the first embodiment has a metal film having a crystalline quality, and has a film that has a crystalline quality and that is formed on the metal film to cover a portion of the metal film. The 2θ position of an X-ray diffraction peak of the metal film covered by the film having a crystalline quality is different from the 2θ position of an X-ray diffraction peak of the metal film not covered by the film having a crystalline quality. Further, the 2θ position of an X-ray diffraction peak of the metal film covered by the film having a crystalline quality is higher than the 2θ position of an X-ray diffraction peak of the metal film not covered by the film having a crystalline quality.

[Method of Making Piezoelectric Film]

FIGS. 2A and 2B and FIGS. 3A and 3B are drawings illustrating examples of process steps for making a piezoelectric film according to the first embodiment. In the process step illustrated in FIG. 2A, the silicon substrate 11 having a thickness of approximately 500 micrometers is provided to serve as a support body. The silicon oxide film 12, the titanium oxide film 13, and the platinum film 14 are laminated one over another on the surface of the silicon substrate 11.

More specifically, the silicon oxide film 12 having a film thickness of approximately 600 nm is formed on the surface of the silicon substrate 11 by the CVD (chemical vapor deposition) process, the thermal oxidation process, or the like. After this, the titanium oxide film 13 having a film thickness of approximately 50 nm is laminated on the silicon oxide film 12 by sputtering, a CVD process, or the like. Moreover, the platinum film 14 having a film thickness of approximately 100 nm is laminated on the titanium oxide film 13 by sputtering for which the temperature for film formation is approximately 300 degrees Celsius. The platinum film 14 has a main orientation thereof in the (111) direction. The main orientation of the platinum film 14 may be detected by use of X-ray diffraction (i.e., XRD).

Figure 2A:
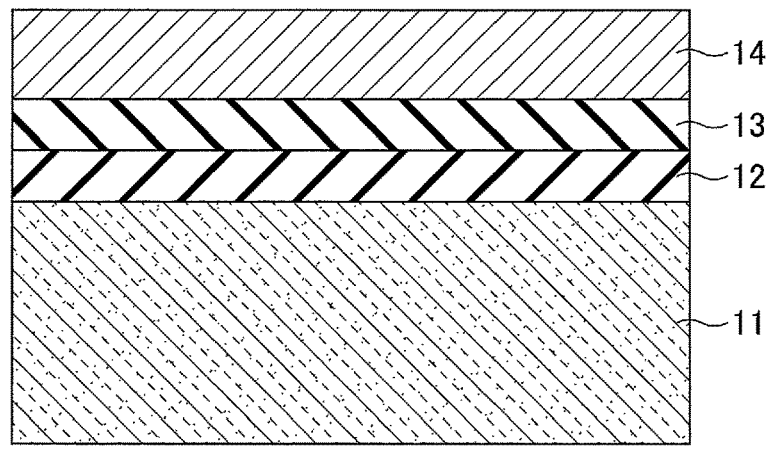
FIGS. 2A and 2B are drawings illustrating an example of process steps for making the piezoelectric film according to the first embodiment.
Figure 2B:
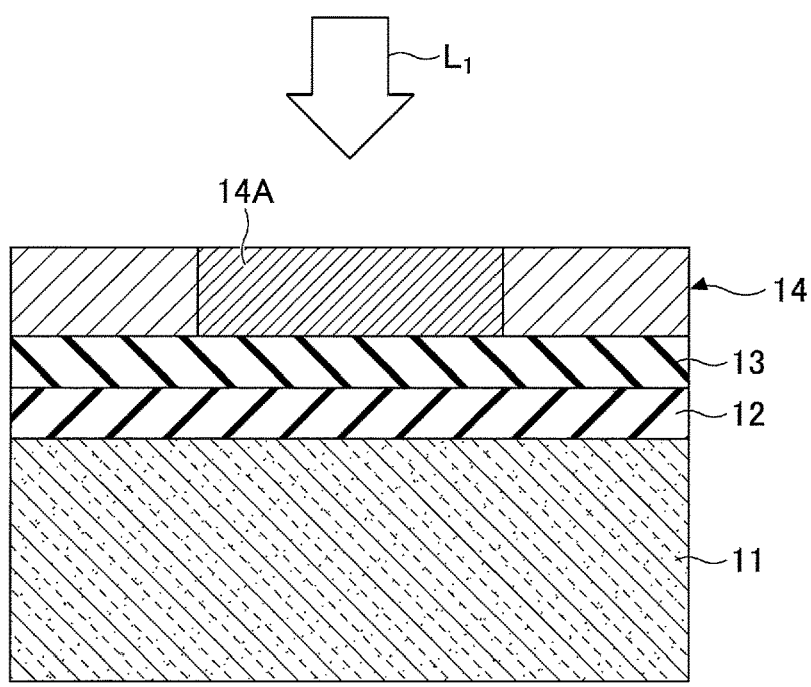

In the process step illustrated in FIG. 2B, the specific portion 14A of the platinum film 14 is irradiated by laser light $L_1$ to be subjected to a heating process. The specific portion 14A corresponds to the position at which the PZT amorphous film 15 is crystallized in the process step illustrated in FIG. 3B, which will be described later. Specifications of the laser light $L_1$ are a matter of design choice. One example of such specifications is as follows.

The laser light $L_1$ may be continuous wave laser light having a wavelength of approximately 980 nm with a rectangular spot of 0.35 mm by 1 mm and with a flat-top energy profile. In the case of the laser light $L_1$ being shone from the same side as the platinum film 14, the irradiation conditions of the laser light $L_1$ may be such that the output power is approximately 80 W, and the scan speed is approximately 10 mm/s.

The absorption coefficient of the platinum film is extremely large around a wavelength of 980 nm, and is approximately $7 \times 10^5$ $cm^{-1}$. Further, light transmissivity around a wavelength of 980 nm is less than or equal to 1% for the platinum film with a film thickness of 100 nm, for example. Because of this, almost all the optical energy of the laser light $L_1$ having a wavelength of approximately 980 nm and irradiating the specific portion 14A of the platinum film 14 is absorbed by the specific portion 14A of the platinum film 14. The optical energy of the laser light $L_1$ absorbed by the specific portion 14A of the platinum film 14 turns into heat (i.e., causes heat to be generated in the platinum film 14), thereby heating the specific portion 14A of the platinum film 14.

The temperature of the heated specific portion 14A (heating temperature) reaches a sufficiently high temperature (e.g., approximately 700 degrees Celsius) that is higher than the temperature for forming the platinum film 14 (which is approximately 300 degrees Celsius in the present embodiment). As a result, recrystallization of the platinum film occurs at the specific portion 14A. Since only the specific portion 14A of the platinum film 14 irradiated by the laser light $L_1$ is heated, the remaining portions of the platinum film 14 are hardly affected. After exposure to the laser light $L_1$, the platinum film of the specific portion 14A irradiated by the laser light $L_1$ has an improved crystalline quality compared to the platinum of the other portions of the platinum film 14.

Figure 3A:
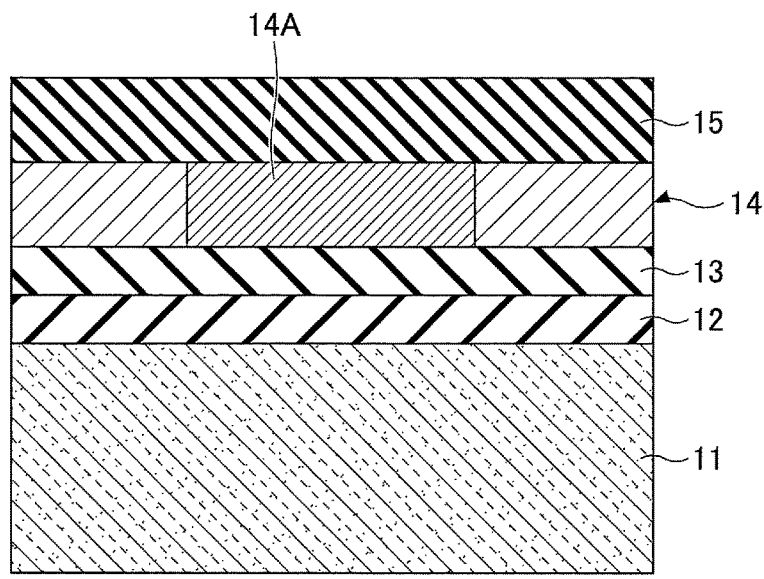
FIGS. 3A and 3B are drawings illustrating an example of process steps for making the piezoelectric film according to the first embodiment.

In the process step illustrated in FIG. 3A, the PZT amorphous film 15 is formed on the platinum film 14 inclusive of the specific portion 14A. Specifically, lead acetate, zirconium alkoxide, and titanium alkoxide compounds serving as starting materials, for example, are dissolved in methoxy ethanol that is a common solution, thereby synthesizing a PZT precursor solution (i.e., PZT sol-gel solution) serving as homogeneous solvent.

A spin-coating process then forms a seed layer by use of $PbTiO_3$ on the platinum film 14, followed by applying the synthesized PZT precursor solution (i.e., PZT sol-gel solution) on the seed layer to form a PZT coating film. The solid content concentration of composite oxide in the synthesized PZT precursor solution may be set to lower than or equal to 0.5 mol/liter, more or less. It may be noted that the formation of the seed layer is not necessarily required. The PZT coating film may be formed directly on the platinum film 14 without forming the seed layer.

Subsequently, the silicon substrate 11 having the PZT coating film formed on the platinum film 14 is placed on a hotplate, for example, and heated to a predetermined temperature (e.g., approximately 220 degrees Celsius) that is higher than or equal to a thermal decomposition starting temperature (e.g., approximately 100 degrees Celsius) and lower than 300 degrees Celsius. This arrangement serves to vaporize the solvent to create a dry condition, with the PZT coating film being thermally decomposed into a solid PZT amorphous film 15 (i.e., non-crystalline oxide film).

Figure 3B:
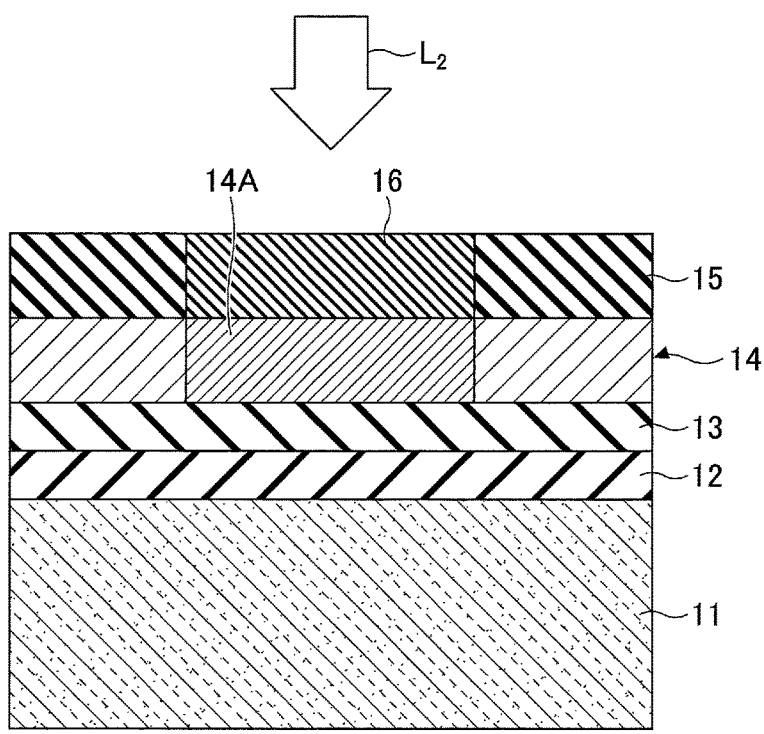

In the process step illustrated in FIG. 3B, the PZT amorphous film 15 is irradiated with laser light $L_2$ at the position of the specific portion 14A of the platinum film 14 to heat and crystalize the PZT amorphous film 15 at the position of the specific portion 14A, thereby forming the PZT crystal film 16. Consequently, the piezoelectric film 10 as illustrated in FIG. 1 is obtained. The specifications of the laser light $L_2$ may be the same as or similar to the specifications of the laser light $L_1$, for example.

As was previously described, the platinum film of the specific portion 14A has better crystalline quality than the platinum of the other portions of the platinum film 14, so that the PZT crystal film 16 formed on the specific portion 14A has an improved crystalline quality.

As described above, the method of making the piezoelectric film 10 according to the first embodiment includes a step of forming a metal film, a metal-film heating step of heating a specific portion of the metal film to recrystallize such a portion, an amorphous-film forming step of forming an amorphous film of piezoelectric material on the metal film, and an amorphous-film crystallizing step of heating, and thus crystallizing, the amorphous film of piezoelectric material at the position of the specific portion of the metal film.

The piezoelectric film 10 was made by use of the process steps illustrated in FIG. 2A through FIG. 3B, and was subjected to XRD analysis. The 2θ position of a peak detected with respect to the specific portion 14A of the platinum film 14 situated under the PZT crystal film 16 was equal to 40.00 degrees. The 2θ position of a peak detected with respect to the platinum film 14 (i.e., the portions other than the specific portion 14A) situated under the PZT amorphous film 15 was equal to 39.98 degrees. Namely, the 2θ position of the peak detected with respect to the specific portion 14A of the platinum film 14 is shifted 0.02 degrees higher than the 2θ position of the peak detected with respect to the other portions of the platinum film 14.

Namely, despite the low film-formation temperature of the platinum film 14 used in the process step illustrated in FIG. 2A, the specific portion 14A of the platinum film 14 is heated prior to the film formation of the PZT amorphous film 15 to improve the film characteristics thereof to provide better crystalline quality, thereby providing the PZT crystal film 16 having good crystalline quality over the position of the specific portion 14A.

Further, the present embodiment uses laser-light-based local heating in a heating process for forming the specific portion 14A and in a heating process for forming the PZT crystal film 16. A heating process can thus be performed while other devices (elements) are integrated on the same substrate. Namely, even when other devices (elements) are situated on the same silicon substrate 11, these other devices are hardly heated, thereby avoiding the degradation of the performance of these devices.

Although the above description has been provided with respect to an example in which continuous wave laser light having a wavelength of 980 nm is used as the laser light $L_1$, the laser light may alternatively have a different wavelength or a different oscillation mode. Moreover, the laser light $L_1$ used for the process of heating the platinum film and the laser light $L_2$ used for crystallizing the PZT amorphous film 15 do not have to have the same specifications. Different types of laser light may be used, for example. The spot shape of the laser light $L_1$ and $L_2$ does not have to be a rectangle, and may alternatively be a square, a circle, an ellipse, or the like. The energy profile of the laser light $L_1$ and $L_2$ does not have to be flat-top, and may alternatively be a Gaussian distribution or the like.

Further, a different metal film may be used in place of the platinum film 14, and may include a metal selected from Ir, Pd, Rh, W, Fe, Ni, Ta, Cr, Zr, Ti, and Au, for example. Moreover, a metal alloy film including an alloy of some of the metals described above, or a laminated-layer film having any of the metal films or any of the metal alloy films selected as desired and laminated one over another, may be used.

Second Embodiment

The second embodiment is directed to an example of a piezoelectric film in which a substrate and a crystal film (i.e., film having a crystalline quality) different from those of the first embodiment are used. In connection with the second embodiment, a description of the same or similar constituent elements as those of the previously provided descriptions may be omitted as appropriate.

[Structure of Piezoelectric Film]

Figure 4:
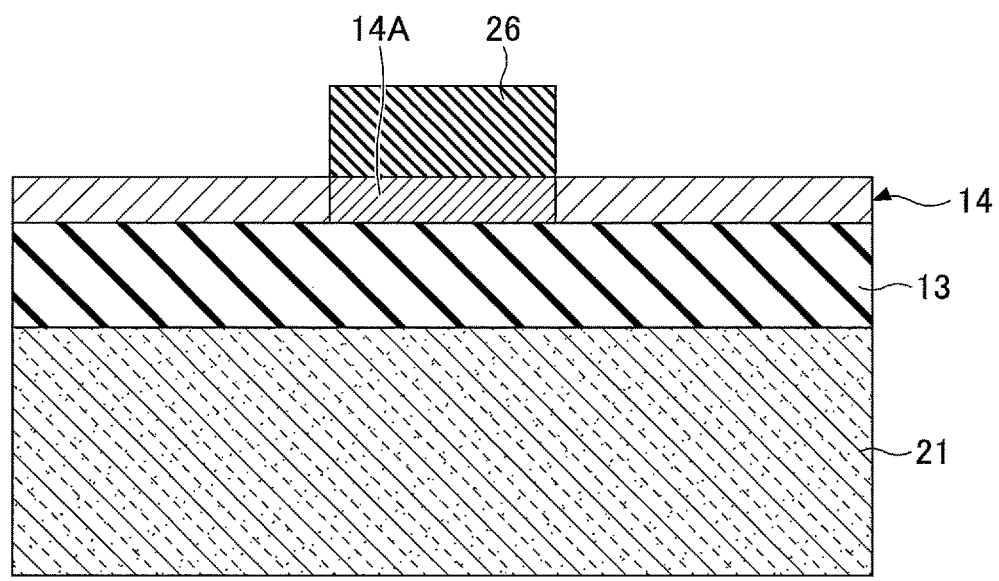
FIG. 4 is a cross-sectional view illustrating an example of a piezoelectric film according to a second embodiment.

FIG. 4 is a cross-sectional view illustrating an example of a piezoelectric film according to the second embodiment. As illustrated in FIG. 4, a piezoelectric film 20 of the second embodiment includes a sapphire substrate 21, a titanium oxide film 13, a platinum film 14, a BTO ($BaTiO_3$: barium titanate) crystal film 26.

In the piezoelectric film 20, the titanium oxide film 13 and the platinum film 14 are laminated one over another on the surface of the sapphire substrate 21. Similarly to the first embodiment, the platinum film 14 has a portion thereof formed as the specific portion 14A. The specific portion 14A, which is a portion of the platinum film 14 having film characteristics thereof improved by local heating, has an improved crystalline quality than the other portions of the platinum film 14.

Similarly to the first embodiment, the 2θ position of an X-ray diffraction peak of the specific portion 14A is different from the 2θ position of an X-ray diffraction peak of the portions of the platinum film 14 other than the specific portion 14A. Further, the 2θ position of an X-ray diffraction peak of the specific portion 14A is higher than the 2θ position of an X-ray diffraction peak of the portions of the platinum film 14 other than the specific portion 14A.

The BTO crystal film 26 is formed on the specific portion 14A of the platinum film 14. Nothing is situated on the portions of the platinum film 14 other than specific portion 14A. The platinum film of the specific portion 14A has better crystalline quality than the platinum of the other portions of the platinum film 14, so that the BTO crystal film 26 formed on the specific portion 14A has an improved crystalline quality.

[Method of Making Piezoelectric Film]

FIGS. 5A and 5B and FIGS. 6A and 6B are drawings illustrating examples of process steps for making a piezoelectric film according to the second embodiment. In the process step illustrated in FIG. 5A, the sapphire substrate 21 having a thickness of approximately 500 micrometers is provided to serve as a support body. The titanium oxide film 13 and the platinum film 14 are laminated one over another on the surface of the sapphire substrate 21.

Specifically, the titanium oxide film 13 having a film thickness of approximately 50 nm is laminated on the surface of the sapphire substrate 21 by sputtering, a CVD process, or the like. Moreover, the platinum film 14 having a film thickness of approximately 100 nm is laminated on the titanium oxide film 13 by sputtering for which the temperature for film formation is approximately 100 degrees Celsius. The platinum film 14 has a main orientation thereof in the (111) direction. The main orientation of the platinum film 14 may be detected by use of X-ray diffraction (i.e., XRD).

Figure 5A:
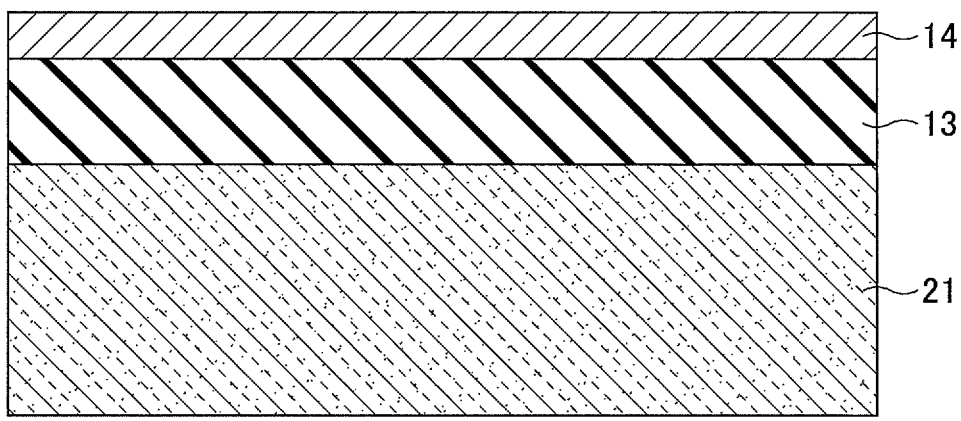
FIGS. 5A and 5B are drawings illustrating an example of process steps for making the piezoelectric film according to the second embodiment.
Figure 5B:
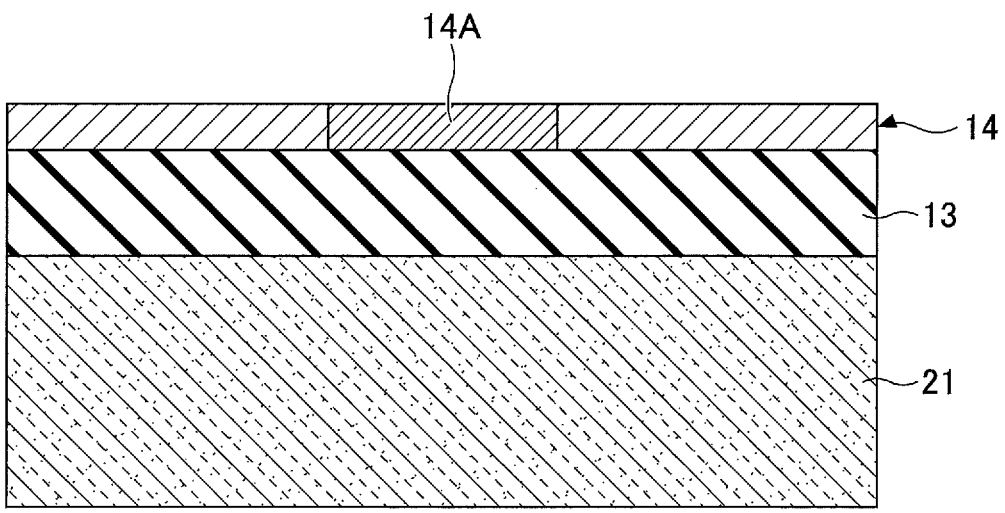
Figure 5B:
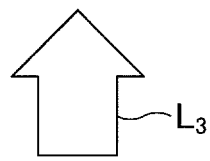

In the process step illustrated in FIG. 5B, the specific portion 14A of the platinum film 14 is irradiated with laser light $L_3$ from the back face of the sapphire substrate 21 to be subjected to a heating process. The specific portion 14A corresponds to the position at which a BTO amorphous film 25 is crystallized in the process step illustrated in FIG. 6B, which will be described later.

The specifications of the laser light $L_3$ may be a matter of design choice. Since irradiation is performed from the back face side of the sapphire substrate 21, it is preferable to select a wavelength that exhibits high transmissivity with respect to the sapphire substrate 21 and that is strongly absorbed by the platinum film 14. This arrangement ensures that the optical energy of the laser light $L_3$ passing through the sapphire substrate 21 to reach the platinum film 14 turns into heat, thereby heating the specific portion 14A of the platinum film 14. An example of such a wavelength may be 532 nm. The spot shape and the energy profile may be the same as or similar to those of the first embodiment.

The temperature of the heated specific portion 14A (heating temperature) reaches a sufficiently high temperature (e.g., approximately 600 degrees Celsius) that is higher than the temperature for forming the platinum film 14 (which is approximately 100 degrees Celsius in the present embodiment). As a result, recrystallization of the platinum film occurs at the specific portion 14A. Since only the specific portion 14A of the platinum film 14 irradiated by the laser light $L_3$ is heated, the remaining portions of the platinum film 14 are hardly affected. After exposure to the laser light $L_3$, the platinum film of the specific portion 14A irradiated by the laser light $L_3$ has an improved crystalline quality compared to the platinum of the other portions of the platinum film 14.

Figure 6A:
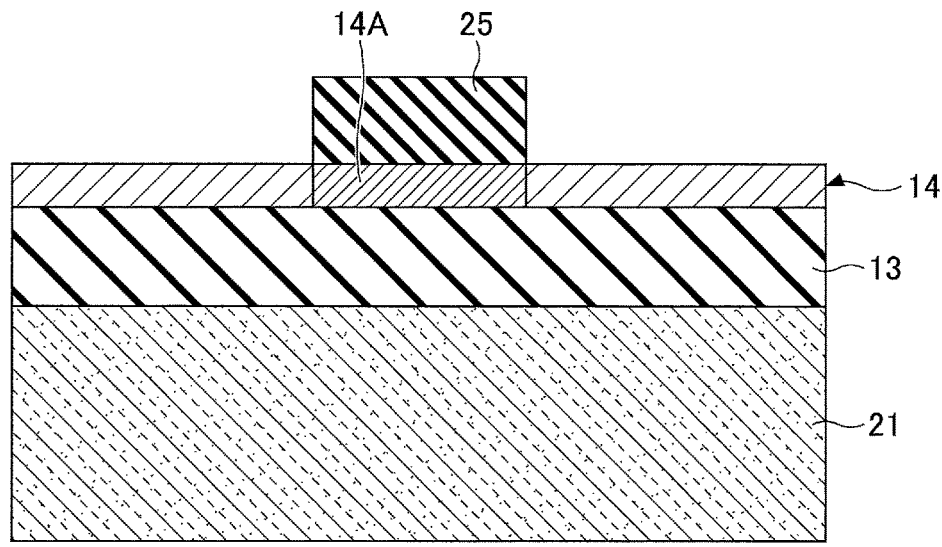
FIGS. 6A and 6B are drawings illustrating an example of process steps for making the piezoelectric film according to the second embodiment.

In the process step illustrated in FIG. 6A, the BTO amorphous film 25 is formed only on the specific portion 14A. Specifically, barium alkoxide and titanium alkoxide compounds serving as starting materials, for example, are dissolved in a common solution, thereby synthesizing a BTO precursor solution (i.e., BTO sol-gel solution) serving as homogeneous solvent. Thereafter, a dispenser process is used to apply the synthesized BTO precursor solution (i.e., BTO sol-gel solution) only on the specific portion 14A to form a BTO coating film.

The sapphire substrate 21 having the BTO coating film formed on the specific portion 14A of the platinum film 14 is placed in a hotplate, for example, and heated to a predetermined temperature (e.g., approximately from 120 degrees Celsius to 300 degrees Celsius) that is higher than or equal to a thermal decomposition starting temperature. This arrangement serves to vaporize the solvent to create a dry condition, with the BTO coating film being thermally decomposed into a solid BTO amorphous film (i.e., non-crystalline oxide film).

Figure 6B:
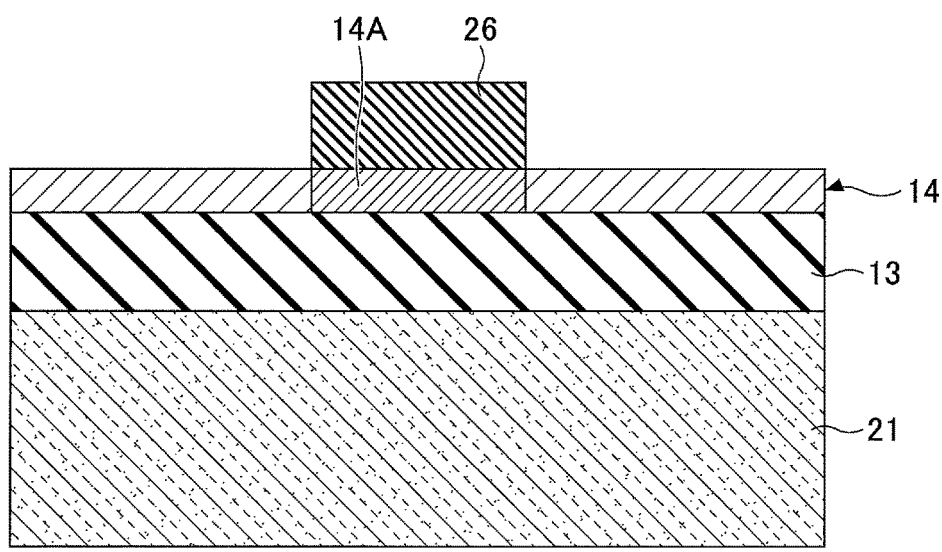

In the process step illustrated in FIG. 6B, the BTO amorphous film 25 formed on the specific portion 14A of the platinum film 14 is irradiated with the laser light $L_4$ from the back face side of the sapphire substrate 21 to heat, and thus crystalize, the BTO amorphous film 25, thereby forming the BTO crystal film 26. Consequently, the piezoelectric film 20 as illustrated in FIG. 4 is obtained. The specifications of the laser light $L_4$ may be the same as or similar to the specifications of the laser light $L_3$, for example.

As was previously described, the platinum film of the specific portion 14A has better crystalline quality than the platinum of the other portions of the platinum film 14, so that the BTO crystal film 26 formed on the specific portion 14A has an improved crystalline quality.

It may be noted that the process steps of FIG. 6A and FIG. 6B may be repeated to increase the thickness of the BTO crystal film 26. This enables the formation of the BTO crystal film 26 having good piezoelectric characteristics only on the specific portion 14A of the platinum film 14.

As described above, the method of making the piezoelectric film 20 according to the second embodiment includes a step of forming a metal film, a metal-film heating step of heating a specific portion of the metal film to recrystallize such a portion, an amorphous-film forming step of forming an amorphous film of piezoelectric material on the metal film, and an amorphous-film crystallizing step of heating, and thus crystallizing, the amorphous film of piezoelectric material at the position of the specific portion of the metal film.

The piezoelectric film 20 was made by use of the process steps illustrated in FIG. 5A through FIG. 6B, and was subjected to XRD analysis. The 2θ position of a peak detected with respect to the specific portion 14A of the platinum film 14 situated under the BTO crystal film 26 was equal to 39.83 degrees. The 2θ position of a peak detected with respect to the portions of the platinum film 14 other than the specific portion 14A was equal to 39.68 degrees. Namely, the 2θ position of the peak detected with respect to the specific portion 14A of the platinum film 14 is shifted 0.15 degrees higher than the 2θ position of the peak detected with respect to the other portions of the platinum film 14.

Namely, despite the low film-formation temperature of the platinum film 14 used in the process step illustrated in FIG. 5A, the specific portion 14A of the platinum film 14 is heated prior to the film formation of the BTO amorphous film 25 to improve the film characteristics thereof to provide better crystalline quality, thereby providing the BTO crystal film 26 having good crystalline quality over the position of the specific portion 14A.

Although the above description has been provided with respect to an example in which continuous wave laser light having a wavelength of 532 nm is used as the laser light $L_3$ in this embodiment, the laser light may alternatively have a different wavelength or a different oscillation mode. Moreover, the laser light $L_3$ used for the process of heating the platinum film 14 and the laser light $L_4$ used for crystallizing the BTO amorphous film 25 do not have to have the same specifications. Different types of laser light may be used, for example. The spot shape of the laser light $L_3$ and $L_4$ does not have to be a rectangle, and may alternatively be a square, a circle, an ellipse, or the like. The energy profile of the laser light $L_3$ and $L_4$ does not have to be flat-top, and may alternatively be a Gaussian distribution or the like.

Further, a different metal film may be used in place of the platinum film 14, and may include a metal selected from Ir, Pd, Rh, W, Fe, Ni, Ta, Cr, Zr, Ti, and Au, for example. Moreover, a metal alloy film including an alloy of some of the metals described above, or a laminated-layer film having any of the metal films or any of the metal alloy films selected as desired and laminated one over another, may be used.

Although the present embodiment is directed to an example in which a BTO (BaTiO$_3$) crystal film is formed, an ABO$_3$ perovskite crystal film other than the PZT crystal film or the BTO crystal film may alternatively be used. The ABO$_3$ perovskite crystal film may be ferroelectric material containing lead or ferroelectric material containing no lead.

Such a material is expressed as ABO3 in a general formula, and corresponds to a composite oxide having A=Pb, Ba, Sr and B=Ti, Zr, Sn, Ni, Zn, Mg, Nb as main components. A specific expression may be (Pb1-x, Ba) (Zr, Ti)O$_3$ and (Pb1-x, Sr) (Zr, Ti)O$_3$, which correspond to cases in which Pb in the A site is partly replaced with Ba and Sr, respectively. Such replacement is possible in the case of a divalent element, and has the function to reduce property degradation caused by the vaporization of lead during a heating process.

Although the present embodiment is directed to an example in which the BTO coating film is formed by use of a dispenser process, a different formation process such as an inkjet printing process or a spray process may alternatively be used.

Third Embodiment

The third embodiment is directed to a variation of the first embodiment. In connection with the third embodiment, a description of the same or similar constituent elements as those of the previously provided descriptions may be omitted as appropriate.

Figure 7:
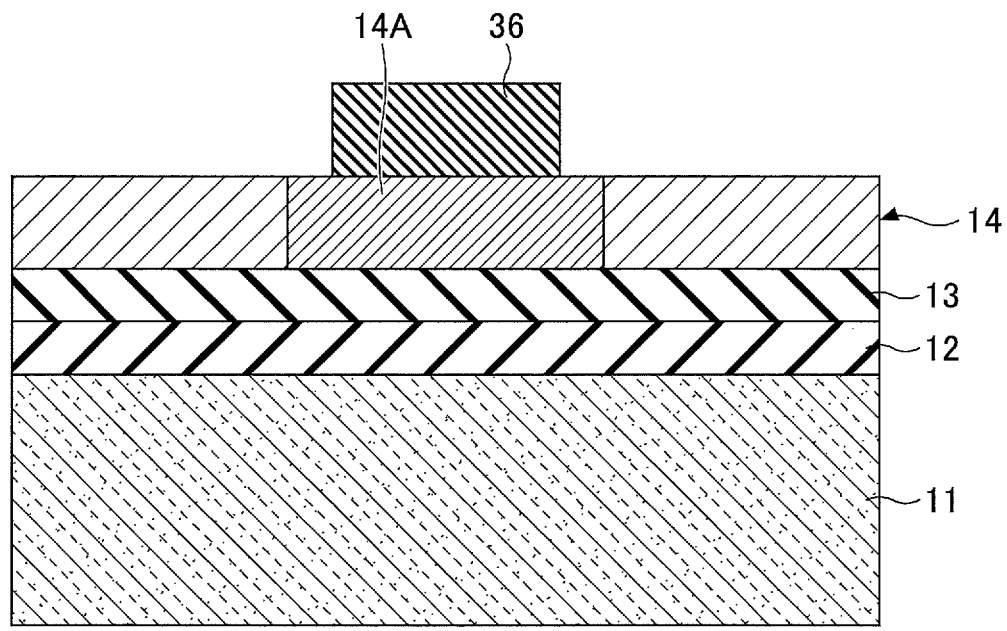
FIG. 7 is a cross-sectional view illustrating an example of a piezoelectric film according to a third embodiment.

FIG. 7 is a cross-sectional view illustrating an example of a piezoelectric film according to the third embodiment. By referring to FIG. 7, a piezoelectric film 30 of the third embodiment differs from the piezoelectric film 10 of the first embodiment (see FIG. 1) in that the PZT crystal film 16 is replaced with a PZT crystal film 36 and the PZT amorphous film 15 is not present.

In the piezoelectric film 30, the PZT crystal film 36 is formed only around the center of the specific portion 14A of the platinum film 14. The PZT crystal film 36 is not in existence on the perimeter area of the specific portion 14A. The characteristics of the PZT crystal film 36 are the same as those of the PZT crystal film 16.

In order to make the piezoelectric film 30, the same or similar process steps as those illustrated in FIG. 2A through FIG. 3B of the first embodiment are performed. Thereafter, all the PZT amorphous film 15 and the perimeter portion of the PZT crystal film 16 illustrated in FIG. 3B are removed by etching through a photolithography process, for example, for the purpose of conformation to the device size. The PZT crystal film 36 is what is left of the PZT crystal film 16 after the removal of the perimeter portion by etching.

In the piezoelectric film 30, a portion in the vicinity of the boundary between the area irradiated with laser light for the purpose of crystallization and the area irradiated with no laser light is removed. This arrangement serves to remove the risk of having the fluctuation of the crystalline property of the PZT crystal film due to changes in the temperature distribution near the boundary. As a result, when a plurality of piezoelectric films are formed on a wafer, for example, variation in the characteristics of the piezoelectric films is reduced.

Fourth Embodiment

The fourth embodiment is directed to an example of a piezoelectric device (i.e., piezoelectric element) having a piezoelectric film. In connection with the fourth embodiment, a description of the same or similar constituent elements as those of the previously provided descriptions may be omitted as appropriate.

Figure 8:
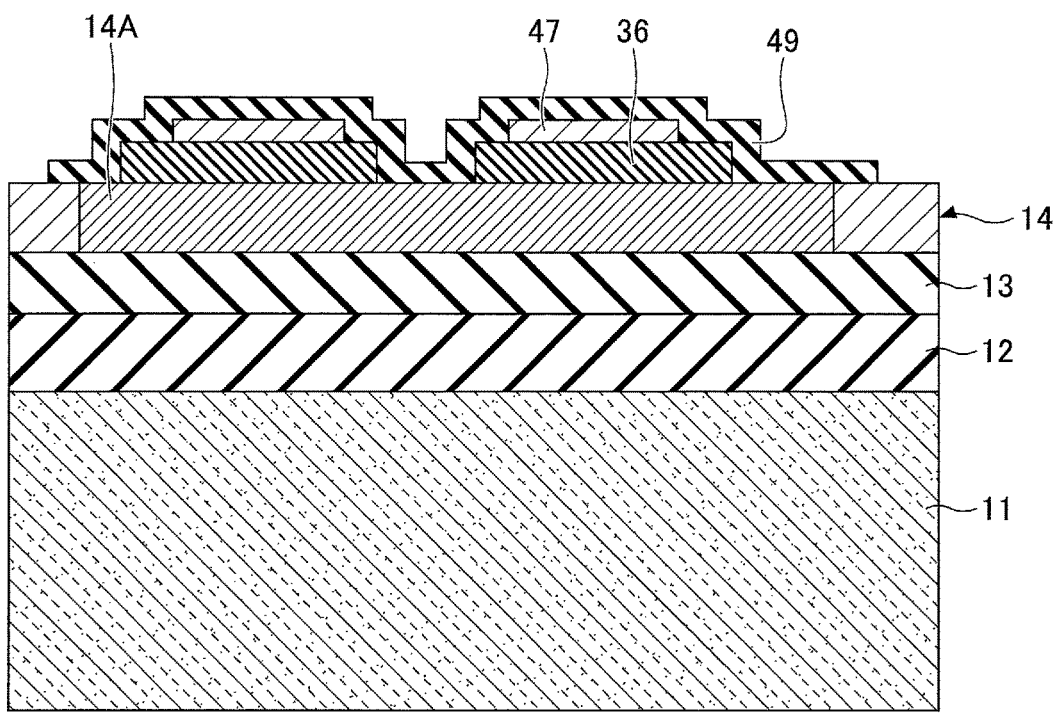
FIG. 8 is a cross-sectional view illustrating an example of a piezoelectric device according to a fourth embodiment.

FIG. 8 is a cross-sectional view illustrating an example of a piezoelectric device according to the fourth embodiment. By referring to FIG. 8, a piezoelectric device 40 according to the fourth embodiment has a structure in which a metal film 47 and a protective film 49 are formed on the piezoelectric film having the same structure as the piezoelectric film 30 of the third embodiment.

Specifically, the silicon oxide film 12, the titanium oxide film 13, and the platinum film 14 are laminated one over another on the silicon substrate 11, and, also, the specific portion 14A having good crystalline quality is formed in the platinum film 14. Further, a plurality of PZT crystal films 36 are formed separately from each other on the specific portion 14A of the platinum film 14.

Each of the PZT crystal films 36 has the metal film 47 formed thereon at a predetermined area. The metal film 47 may be a platinum film with a film thickness of approximately 100 nm, for example. In order to improve the reliability of the piezoelectric device 40, the protective film 49 is disposed on the platinum film 14 to cover the PZT crystal films 36 and the metal films 47. An aluminum film or the like may be used as the protective film 49, for example.

In the piezoelectric device 40, the platinum film 14 serves as a lower electrode, and the metal films 47 serve as upper electrodes. Application of voltage between the platinum film 14 serving as the lower electrode and the metal films 47 serving as the upper electrodes causes the PZT crystal film 36 to exhibit a mechanical displacement.

The piezoelectric device 40 may be used as a component of a liquid ejecting head in an inkjet recording apparatus or the like, for example. Moreover, the piezoelectric device 40 may be used as a component in a micro pump, an ultrasonic motor, an acceleration sensor, a projector biaxial scanner, a transfusion pump, etc.

Fifth Embodiment

The fifth embodiment is directed to an example in which a piezoelectric device and another device are formed on the same substrate. In connection with the fifth embodiment, a description of the same or similar constituent elements as those of the previously provided descriptions may be omitted as appropriate.

FIG. 9 is a cross-sectional view illustrating an example of a piezoelectric device according to the fifth embodiment. By referring to FIG. 9, a piezoelectric device 50 according to the fifth embodiment has a structure in which a semiconductor device 51 is formed on the silicon substrate 11 of the piezoelectric device 40 of the fourth embodiment. The semiconductor device 51 is a drive IC (integrated circuit) for driving the piezoelectric device 40, for example.

In order to make the piezoelectric device 50, the semiconductor device 51 is first formed on the silicon substrate 11, for example. After placing a mask having openings that expose only the areas in which the PZT crystal films 36 are to be formed, the PZT crystal films 36 are formed on the specific portion 14A in the openings according to the process steps described in connection with the first embodiment.

As was previously described, the present embodiment uses laser-light-based local heating in a heating process for forming the specific portion 14A and in a heating process for forming the PZT crystal films 36. Namely, even when the semiconductor device 51 is situated on the same silicon substrate 11, the semiconductor device 51 is hardly heated, thereby avoiding the degradation of the performance of the semiconductor device 51.

The same advantage is also obtained in the case in which different devices such as a sensor and a communication device are implemented on the silicon substrate 11 in place of the semiconductor device 51. Namely, even when one or more devices are situated on the same substrate in addition to the piezoelectric device 40 subjected to heating, these one or more devices are not needlessly heated, which makes unlikely the occurrence of heat-induced damage and misalignment due to thermal stress. The performance degradation of the one or more devices can thus be avoided.

Further, the present invention is not limited to these embodiments, but various variations and modifications may be made without departing from the scope of the present invention.

For example, the disclosed embodiments have been directed to an example in which laser light is used as an electromagnetic wave for a heating process. The electromagnetic wave is not limited to laser light, and may be any type of electromagnetic wave as long as the electromagnetic wave is capable of heating the intended object (i.e., is capable of being absorbed by the intended object). For example, a flash lamp or the like may be used for producing such an electromagnetic wave.

According to at least one embodiment, a method of making a piezoelectric film is provided that is capable of improving the crystalline quality of a piezoelectric-material crystal film without affecting other components or the like formed on the same substrate.

RELATED-ART DOCUMENTS

Patent Document

[Patent Document 1] Japanese Unexamined Patent Application Publication No. 2014-154581

What is claimed is:

1. A piezoelectric film comprising:

a metal film having a crystalline quality; and a film having a crystalline quality and formed on the metal film to cover a first area of the metal film, wherein the metal film has the first area and a second area, the first area being covered by the film having a crystalline quality, the second area being not covered by the film having a crystalline quality, and wherein the first area has a recrystallized structure while the second area has a non-recrystallized structure, such that a $2\theta$ position of an X-ray diffraction peak of the first area is different from a $2\theta$ position of an X-ray diffraction peak of the second area.

2. The piezoelectric film according to claim 1, wherein the $2\theta$ position of the X-ray diffraction peak of the first area is higher than the $2\theta$ position of the X-ray diffraction peak of the second area.

3. The piezoelectric film according to claim 1, wherein the film having a crystalline quality is crystalized on the metal film.

4. The piezoelectric film according to claim 1, wherein the film having a crystalline quality is an oxide film.

5. The piezoelectric film according to claim 1, wherein the film having a crystalline quality is made of piezoelectric material.

6. The piezoelectric film according to claim 1, wherein the film having a crystalline quality is made of $ABO_3$ piezoelectric material.

7. A piezoelectric device comprising the piezoelectric film of claim 1.

* * * * *